(12) United States Patent
Phillips, Jr. et al.

(10) Patent No.: US 6,512,430 B2
(45) Date of Patent: Jan. 28, 2003

(54) PASSIVE LOW PASS FILTER

(75) Inventors: William Thomas Phillips, Jr., Boardman, OH (US); Dominic Anthony Messuri, Canfield, OH (US); Joseph V. Mantese, Shelby Township, Macomb County, MI (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/895,736

(22) Filed: Jun. 29, 2001

(65) Prior Publication Data
US 2002/0000896 A1 Jan. 3, 2002

Related U.S. Application Data
(60) Provisional application No. 60/215,021, filed on Jun. 29, 2000.

(51) Int. Cl.$^7$ ................................................ H03H 7/01
(52) U.S. Cl. ........................................ 333/185; 333/184
(58) Field of Search ............................... 333/181, 184, 333/185, 175; 336/83, 200, 223, 232

(56) References Cited

U.S. PATENT DOCUMENTS

| | | | | |
|---|---|---|---|---|
| 4,904,967 A | * | 2/1990 | Morii et al. ............... | 333/167 |
| 5,051,712 A | * | 9/1991 | Naito et al. ............... | 333/184 |
| 5,602,517 A | * | 2/1997 | Kaneko et al. ............ | 333/185 |
| 6,114,925 A | * | 9/2000 | Lo ............................ | 333/185 |
| 6,147,573 A | * | 11/2000 | Kumagai et al. .......... | 333/185 |

FOREIGN PATENT DOCUMENTS

JP 061614288 A * 6/1994

\* cited by examiner

*Primary Examiner*—Seungsook Ham
(74) *Attorney, Agent, or Firm*—Thomas N. Twomey

(57) ABSTRACT

A passive low pass, π-type filter of a surface mounted device configuration has two stack capacitors disposed radially inwardly of a coil, otherwise known as an inductor. Each capacitor has a number of ground plates successively stacked between a number of signal plates. The ground plates electrically engage a front and rear ground band which circles the external surface of a non-conductive encapsulant of the filter. A forward and rearward conductive member or sheet engages each end of the encapsulant. One end of the coil is engaged to the front sheet and the opposite end is engaged to the rear sheet. The signal plates of the forward capacitor are engaged to the front sheet and the signal plates of the rearward capacitor are engaged electrically to the rear sheet.

15 Claims, 3 Drawing Sheets

PASSIVE LOW PASS FILTER

This application claims the benefit of U.S. Provisional Application No. 60/215,021 filed Jun. 29, 2000, the disclosures of which are incorporated herein by reference in their entirety as if set forth at length.

TECHNICAL FIELD

This invention relates to a passive low pass filter and more particularly to a passive low pass, π-type, filter of a surface mount device configuration.

BACKGROUND OF THE INVENTION

Low pass filters are circuits used in computer, communications, and automotive industries. Currently, discrete components such as ferrite block and surface mounted device, SMD, capacitors are used as low pass filters to reduce noise generated by nearby electrical components. The filters reduce or attenuate noise induced frequencies which lie outside a preferred filter pass band, while passing electrical signals having frequencies within the specified pass band. Therefore, the passive low pass filter behaves as a frequency sensitive voltage divider. At high frequencies the output behaves as if it is shorted while at low frequencies the output appears as an open circuit.

Passive low pass filters comprise one or more inductances and capacitances tuned to suppress or attenuate the unwanted signals while allowing passage of a band of wanted signals. A typical low pass filter has an inductor, a capacitor and a dielectric encapsulant. The encapsulant can be formed from a variety of non-conducting materials, including dielectrics, ferrites, and dielectric-ferrite composites, and commonly encases the filter and engages to and separates a plurality of plates which comprise the capacitor. A variety of low pass filters of a surface mount configuration exist, they include a T-filter, a LC-filter and a π-filter.

The consumer markets for low pass filters are requiring greater frequency attenuation utilizing smaller components. The layout of the SMD filter is such that electric and magnetic containment must be substantially maintained within the entire yet downsized volume of the encapsulant. As attenuation increases, noise produced within the filter itself becomes a greater problem. The magnetic field of the inductor, otherwise known as a coil, may produce a form of noise known as eddy currents across the signal plates.

SUMMARY OF THE INVENTION

A passive low pass, π-type, filter of a surface mounted device configuration has two stacked capacitors disposed radially inwardly of a coil. Each capacitor has a number of ground plates successively stacked between a number of signal plates. The ground plates electrically engage a front and rear ground band which circles the external surface of a non-conductive encapsulant of the filter. A front and rear conductive member or sheet engages each end of the encapsulant. One end of the coil is engaged to the front sheet and the opposite end is engaged to the rear sheet. The signal plates of the forward capacitor are engaged to the front sheet and the signal plates of the rearward capacitor are also engaged electrically to the rear sheet. Preferably, a centerline of the coil is disposed perpendicular to and intersects a shared centerline of the front and rear bands.

Thus, advantages of the present invention is a reduced size while maintaining or maximizing power dissipation through the filter, and the elimination of eddy noise-producing currents.

BRIEF DESCRIPTION OF THE DRAWINGS

The presently preferred embodiment of the invention is disclosed in the following description and the accompanying drawings, wherein.

DETAILED DESCRIPTION OF THE PREFERRED EMBODIMENTS

Figure 1:
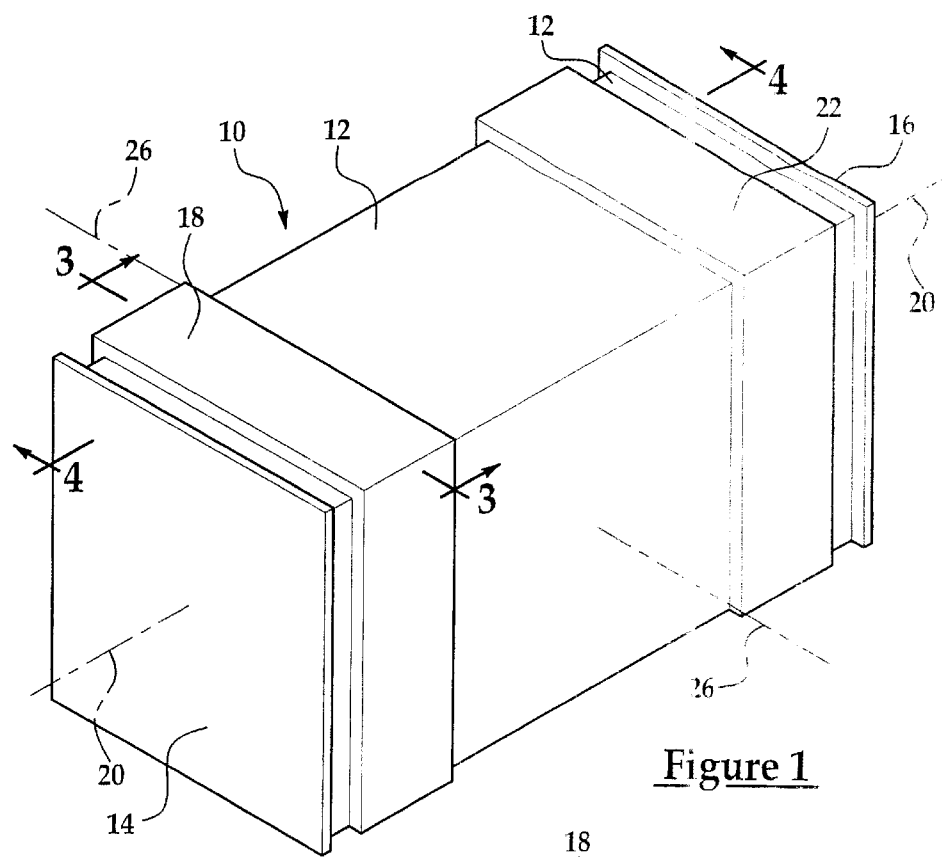
FIG. 1 is a perspective view of a low pass filter of the present invention.
Figure 3:
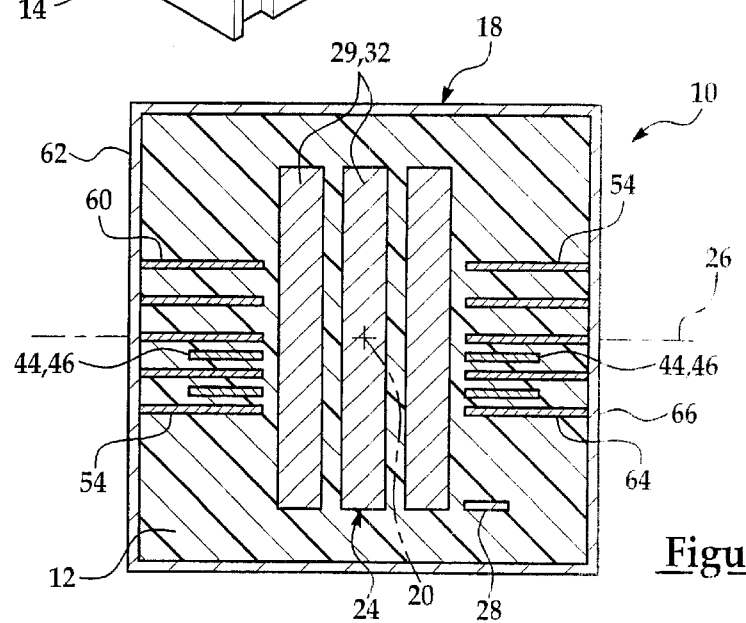
FIG. 3 is a cross section view of the filter taken along line 3—3 of FIG. 1 viewing in the direction of the arrows.
Figure 2:
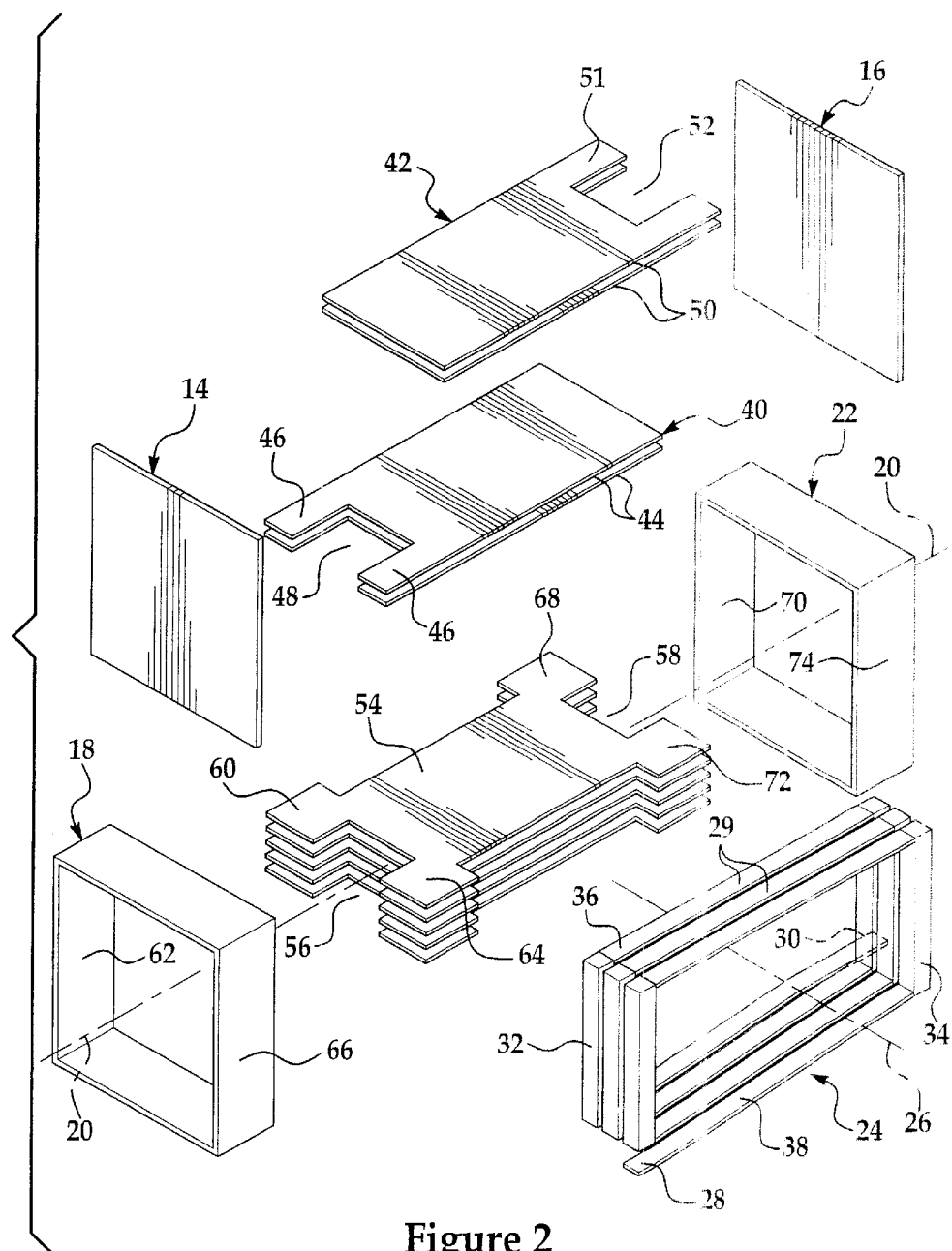
FIG. 2 is an exploded perspective view of the filter with a dielectric encapsulant removed to show internal detail.
Figure 4:
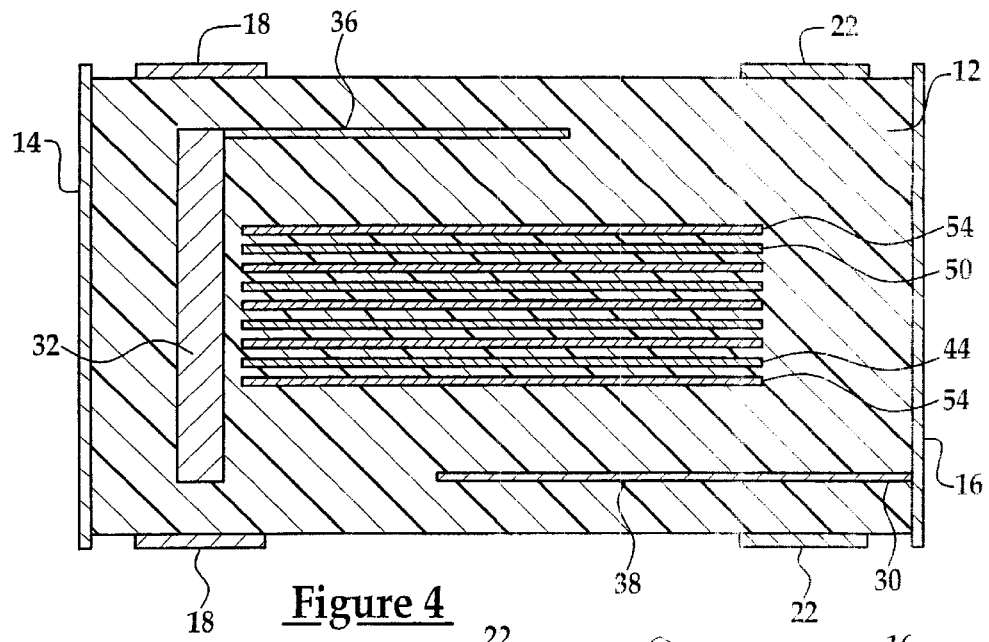
FIG. 4 is a cross section view of the filter taken along line 4—4 of FIG. 1 viewing in the direction of the arrows.
Figure 5:
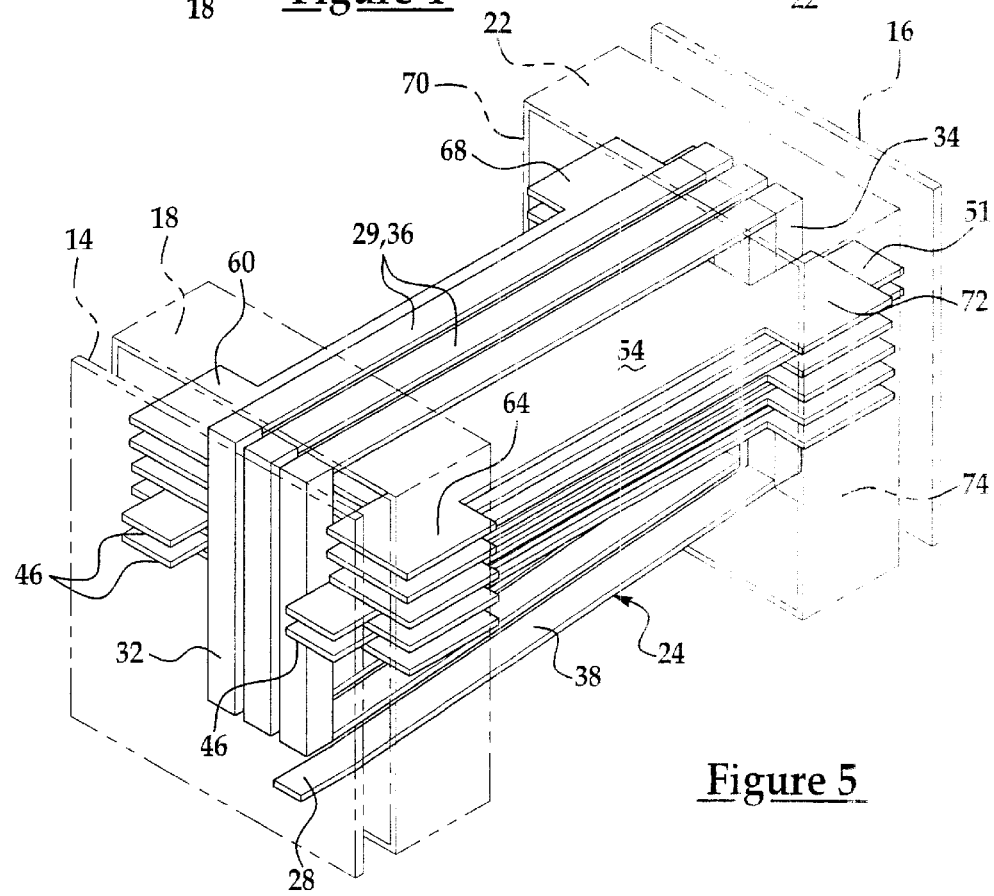
FIG. 5 is a perspective view of the filter with the dielectric encapsulant removed to show internal detail.

Referring to FIG. 1, a surface mounted device, SMD, passive low pass π-filter 10 is shown having an elongated, electrically non-conductive, dielectric encapsulant 12 which is preferably substantially cubicle in shape. Filter 10 also has an electrically conductive positively charged front member or sheet 14 engaged to a forward end of the encapsulant 12 and likewise a positively charged rear member or sheet 16 engaged to the opposite end of the encapsulant 12. Encapsulant 12 is preferably made of a material having ferroelectric and ferromagnetic properties such as EMISorb, a trademark name by Delphi Automotive Inc., Troy, Mich. (also see U.S. Pat. Nos. 5,512,196 and 5,601,748 incorporated herein by reference). The encapsulant may also be made of a variety of other non-conductive filter medias including alumina, baruium titante, PZT, relaxor dielectrics, all ferrites and insulators, and composites made from such materials. Surrounding the exterior of the encapsulant 12 is a front ground band 18 which is disposed substantially near but separated from the perimeter of the front member 14. The front ground band 18 has a center line 20 which centrally traverses the front member 14 and the rear member 16. A rear ground band 22 also circles the encapsulate 12 and is located substantially near but separated from the perimeter of the rear member 16.

Referring to FIGS. 2–5, encased within the encapsulant 12, which has been removed to show detail, is an electrically conductive coil 24 having a center line 26 transversing the center line 20 of the front and rear ground bands 18, 22. The coil 24 has a forward end 28 engaged electrically to the front member 14 and a rearward end 30 engaged electrically to the rear member 16. The coil 24 further has a plurality of windings 29 wherein each winding 29 has a forward vertical member or column 32 and a rearward vertical member or column 34. The members 32, 34 are separated from the front and rear members 14, 16 by the encapsulant 12 and are interconnected at the top and bottoms by substantially horizontal conductive strips 36, 38 which are disposed within the encapsulant in a slanted direction. The slanted bottom strips 38 of the leading and trailing windings 29 of the coil 24 are respectively engaged unitarily to the rearward and forward ends 30, 28 of the coil 24.

Disposed substantially radially within the coil 24 and encased by the encapsulant 12 is a lower capacitor 40 disposed beneath an upper capacitor 42. The lower capacitor 40 has at least one and preferably a series of stacked forward signal plates 44 each having two forward projecting tangs 46 which engage electrically to the front member 14. The tangs 46 extend forward on either side of a forward end gap 48 of the forward signal plates 44, so that the forward end gap 48 is defined by the front member or sheet 14 and the forward edge of the forward signal plate 44. The upper capacitor 42 has at least one and preferably a series of rearward signal plates 50 each having two tangs 51 which project rearward to engage the rear member 16. The tangs are disposed on either side of a rearward end gap 52 which is defined by a rearward edge of the rearward signal plate 50 and the rear member 16. The forward signal plates 44 are disposed parallel to the rearward signal plates 50 which are parallel to an imaginary plane formed by the intersecting centerlines 20, 26.

A plurality of ground plates 54 are stacked successively between the forward and rearward signal plates 44, 50 of the lower and upper capacitors 40, 42. The ground plates 54 are disposed parallel to the signal plates 44, 50 and are separated therefrom at a pre-defined distance by the encapsulant 12 to establish the required capacitance. When energized, capacitors 40, 42 produce an electric field which is perpendicular to the plates. The coil or inductor 24 produces a magnetic field and is orientated so that the magnetic field is substantially perpendicular to the electric field. This configuration maximizes power dissipation through the filter 10 regardless of the encapsulant material and minimizes noise-producing eddy currents induced by the coil 24 on the ground plates 54.

Each ground plate 54 has a forward end notch 56 which is aligned over or below and is substantially the same size as the forward end gap 48 of the forward signal plates 44. Likewise, each ground plate 54 has a rearward end notch 58 which is centered over or below the corresponding rearward end gap 52 and, likewise, is substantially the same size as the gap 52. The forward vertical members 32 of the coil 24 traverse through the forward end gaps and notches 48, 56 and are electrically insulated from the lower and upper capacitors 40, 42 by the encapsulant 12. The rearward vertical members 34 traverse through the rearward end gaps and notches 52, 58 and, likewise, are electrically insulated from the capacitors 40, 42 by the encapsulant 12.

The ground plates 54 are engaged electrically at all four corners to the respective front and rear ground bands 18, 22. Each ground plate 54 has a left forward tab 60 which engages a left ground member 62 of the forward ground band 18, and is disposed substantially vertically and perpendicular to the ground plate 54. A right forward tab 64 projects laterally outward away from the forward end notch 56 to electrically engage a right ground member 66 of the front ground band 18. The left and right forward tabs 60, 64 project axially outward on either side of the coil 24 and in reference to the center line 26. Similarly, a left rearward tab 68 projects from the ground plate 54 away from the rearward vertical members 34 to engage a left ground member 70 of the rear ground band 22. An opposing right rearward tab 72 projects from the ground plate 54 away from the rearward vertical members 34 and electrically engages a right ground member 74 of the rear ground band 22. Preferably, the left ground member 62 is parallel to the right ground member 66, and the left ground member 70 is parallel to the right ground member 74. The ground connections to the ground bands 18, 22 which lay on the exterior of the filter 10 are so orientated to minimize the equivalent series inductance, ESL.

The low pass filter 10 is preferably manufactured in layers comprising mostly of the encapsulant 12 material. When layering, the various ground and signal plates are plated upon, adhered, or embedded within respective layers of the dielectric encapsulant 12. The forward and rearward members 32, 34 of the coil 24 are formed by a series of vias which individually penetrate each layer and are aligned vertically thereby forming the single column shape.

Although the preferred embodiments of the present invention have been disclosed, various changes and modifications may be made thereto by one skilled in the art without departing from the scope and spirit of the invention as set forth in the appended claims. It is also understood that the terms used herein are merely descriptive, rather than limiting, and that various changes may be made without departing from the scope and spirit of the invention.

We claim:

1. A passive low pass filter of a surface mount device configuration comprising:
    a substantially non-conductive encapsulant;
    a coil encased in the encapsulant, the coil having a forward end, a rearward end, and a horizontal centerline;
    a vertical positively charged front member engaged to the forward end of the coil;
    a vertical positively charged rear member engaged to the rearward end of the coil, the coil and the centerline disposed between the front and rear members;
    a vertical side ground member engaged externally to the encapsulant; and
    a capacitor encased in the encapsulant and disposed radially inward from the coil, the capacitor having a horizontal ground plate engaged to the side ground member and a horizontal signal plate engaged to the front member.

2. The filter as set forth in claim 1 wherein the ground plate has a left forward tab projecting horizontally and engaged to the side ground member.

3. The filter as set forth in claim 2 further comprising:
    a front ground band having a left ground member and a centerline, wherein the side ground member is the left ground member, the centerline of the front ground band disposed perpendicular to the centerline of the coil, the coil disposed radially inward of the front ground band, the left forward tab of the ground plate engaged to the left ground member of the front ground band.

4. The filter as set forth in claim 3 wherein the coil has a plurality of windings disposed between the forward and rearward ends, each one of the plurality of windings having a forward vertical member disposed radially inward to the front ground band.

5. The filter as set forth in claim 4 further comprising:
    the front ground band having a right side ground member disposed opposite the left side ground member; and
    the ground plate having a forward end notch and a right forward tab engaged to the right side ground member, the forward end notch defined between the left and right forward tabs, the forward vertical members of the coil extending through the notch.

6. The filter as set forth in claim 5 wherein the signal plate has a forward end gap through which the forward vertical members of the coil extend.

7. A passive low pass filter of a surface mount device configuration comprising:
    a substantially non-conductive encapsulant;
    a coil encased in the encapsulant, the coil having a forward end, a rearward end, a horizontal centerline, and a plurality of windings disposed between the forward and rearward ends;

a vertical positively charged front member engaged to the forward end of the coil;

a vertical positively charged rear member engaged to the rearward end of the coil, the coil and the centerline disposed between the front and rear members;

a front ground band engaged externally to the encapsulant, the band having a left ground member, an opposite right ground member and a centerline, the centerline of the front ground band disposed perpendicular to the centerline of the coil, the coil disposed radially inward of the front ground band, wherein each one of the plurality of windings of the coil has a forward vertical member disposed radially inward to the front ground band;

a horizontal ground plate having a left forward tab projecting horizontally and being engaged to the left ground member, a right forward tab projecting horizontally and being engaged to the right side ground member, and a forward end notch defined between the left and right forward tabs, wherein the forward vertical members of the coil extend through the notch;

a horizontal signal plate engaged to the front member, the signal plate having a forward end gap through which the forward vertical members of the coil extend; and wherein the signal plate has two tangs projected forward to engage the front member, the forward end gap defined between the two tangs.

8. The filter as set forth in claim 7 further comprising:

the horizontal signal plate being a forward signal plate;

a rearward signal plate disposed parallel to the forward signal plate and engaged to the rear member, the ground plate disposed between and separated from the rearward and forward signal plates by the encapsulant, the rearward signal plate having a rearward end gap and two tangs projected rearward to engage the rear member, the rearward end gap defined between the two tangs of the rearward signal plate; and the plurality of windings of the coil each having a rearward vertical member extended through the rearward end gap.

9. The filter as set forth in claim 8 further comprising:

a rear ground band having a right side ground member disposed opposite a left side ground member; and the ground plate having a rearward end notch, a left rearward tab, and a right rearward tab, the left rearward tab engaged to the left side ground member of the rear ground band and the right rearward tab engaged to the right side ground member of the rear ground band, the rearward end notch defined between the left and right rearward tabs, the rearward vertical members of the coil extending through the rearward end notch.

10. The filter as set forth in claim 9 wherein the forward and rearward vertical members of the coil are each a plurality of vias stacked vertically upon one another.

11. The filter as set forth in claim 9 wherein the encapsulant material is EMISorb.

12. A passive low pass filter of a surface mount device configuration comprising:

an encapsulant;

a coil encased in the encapsulant, the coil having a forward end, a rearward end, and a centerline;

a positively charged front member engaged to the forward end of the coil;

a positively charged rear member engaged to the rearward end of the coil, the coil and the centerline disposed between the front and rear members;

a ground band engaged externally to and encircling the encapsulant, the ground band having a centerline disposed perpendicular to the centerline of the coil;

a ground plate engaged to the ground band and encased by the encapsulant;

a signal plate engaged to the front member and encased by the encapsulant, the signal plate being parallel to the ground plate and directly separated from the ground plate by the encapsulant; and wherein the centerline of the coil and the centerline of the ground band lie within an imaginary plane which is disposed parallel to the ground plate.

13. The filter set forth in claim 12 comprising:

a first capacitor having the ground plate and the signal plate, the ground plate disposed beneath the signal plate; and a second capacitor disposed above the first capacitor, the second capacitor having a ground plate disposed beneath a signal plate, the signal plate of the second capacitor engaged to the rear member.

14. The filter set forth in claim 13 comprising:

the ground band being a front ground band disposed near the front member; and a rear ground band engaged externally to and encircling the encapsulant near the rear member, the rear ground band centered about the centerline of the front ground band, each of the ground plates of the first and second capacitors being engaged electrically to the front and rear ground bands at all four corners.

15. The filter set forth in claim 14 comprising a ground plate disposed above the second capacitor and engaged to the front and rear ground bands at all four corners.

* * * * *